(12) United States Patent
Heidari et al.

(10) Patent No.: US 7,704,425 B2
(45) Date of Patent: Apr. 27, 2010

(54) PATTERN REPLICATION WITH INTERMEDIATE STAMP

(75) Inventors: Babak Heidari, Furulund (SE); Anette Löfstrand, Lund (SE); Erik Bolmsjö, Malmö (SE); Erik Theander, Lund (SE); Marc Beck, Höör (SE)

(73) Assignee: Obducat AB, Malmo (SE)

( * ) Notice: Subject to any disclaimer, the term of this patent is extended or adjusted under 35 U.S.C. 154(b) by 1047 days.

(21) Appl. No.: 11/268,574

(22) Filed: Nov. 8, 2005

(65) Prior Publication Data

US 2006/0279025 A1    Dec. 14, 2006

Related U.S. Application Data

(60) Provisional application No. 60/595,154, filed on Jun. 10, 2005.

(30) Foreign Application Priority Data

Jun. 10, 2005    (EP)    ................... 05105100

(51) Int. Cl.
  *B29C 59/02* (2006.01)
(52) U.S. Cl. ................. 264/220; 264/293; 264/319; 264/320; 264/479; 264/494; 264/496
(58) Field of Classification Search ................. 264/479, 264/496, 500, 293, 319, 320, 494, 220; 977/700
See application file for complete search history.

(56) References Cited

U.S. PATENT DOCUMENTS

| | | | |
|---|---|---|---|
| 2,305,433 A * | 12/1942 | Kyle | ............ 264/338 |
| 5,772,905 A | 6/1998 | Chou | |
| 6,334,960 B1 | 1/2002 | Willson et al. | |
| 6,939,664 B2 * | 9/2005 | Huang et al. | ............. 430/270.1 |
| 2002/0092962 A1 * | 7/2002 | Domeier et al. | ............ 249/60 |

(Continued)

FOREIGN PATENT DOCUMENTS

DE    3714011 A1    2/1988

(Continued)

OTHER PUBLICATIONS

T. Nielsen et al., "Nanoimprint lithography in the cyclic olefin copolymer, Topas®, a highly UV-transparent and chemically resistant thermoplast", Journal of Vacuum Science & Technology, vol. 22., No. 4., Jul. 2004.

*Primary Examiner*—Khanh Nguyen
*Assistant Examiner*—Saeed M Huda
(74) *Attorney, Agent, or Firm*—Renner, Otto, Boisselle & Sklar, LLP

(57) ABSTRACT

The invention relates to a two-step process for transferring a pattern from a template (1) to a target surface of a substrate, by creating an intermediate flexible polymer stamp (5) from the template in a primary step, and then using the polymer stamp to make an imprint in a radiation-sensitive moldable layer on the target surface in a secondary step. In the secondary step, the process steps of pressing the polymer stamp and the substrate against each other, UV exposure of the moldable layer through the polymer stamp, and postbaking of the radiated moldable layer, are all performed at a control constant temperature, in order to eliminate damages to the pattern created in the moldable layer caused by thermal expansion effects.

32 Claims, 8 Drawing Sheets

U.S. PATENT DOCUMENTS

| | | | |
|---|---|---|---|
| 2003/0071016 A1* | 4/2003 | Shih et al. | 216/54 |
| 2003/0230817 A1* | 12/2003 | Crook | 264/1.38 |
| 2004/0032063 A1* | 2/2004 | Walther | 264/544 |
| 2004/0183236 A1* | 9/2004 | Ogino et al. | 264/496 |
| 2005/0082700 A1* | 4/2005 | Deeman et al. | 264/2.5 |
| 2005/0084804 A1* | 4/2005 | Truskett et al. | 430/311 |
| 2005/0208779 A1* | 9/2005 | Klauk et al. | 438/795 |
| 2006/0110914 A1* | 5/2006 | Gehoski et al. | 438/627 |

FOREIGN PATENT DOCUMENTS

| | | |
|---|---|---|
| EP | 0 813 255 A1 | 12/1997 |
| EP | 1 160 775 A2 | 12/2001 |
| EP | 1 465 175 A1 | 10/2004 |
| EP | 1 533 657 A1 | 5/2005 |
| GB | 637105 | 5/1950 |
| JP | 2002086463 | 3/2002 |
| JP | 2003272250 | 9/2003 |
| WO | WO 01/42858 A1 | 6/2001 |
| WO | WO 03/031096 A2 | 4/2003 |
| WO | WO 2004/021083 A1 | 3/2004 |
| WO | WO 2005/109095 * | 11/2005 |
| WO | 2005/119360 | 12/2005 |

* cited by examiner

PATTERN REPLICATION WITH INTERMEDIATE STAMP

CROSS REFERENCE TO RELATED APPLICATIONS

This application claims the right to priority based on European Application No. 05105100.1, filed Jun. 10, 2005, and claims the benefit of U.S. Provisional Application No. 60/595,154, filed Jun. 10, 2005, the content of both of which is incorporated herein by reference in its entirety.

FIELD OF THE INVENTION

The present invention relates to a pattern transfer process for imprint lithography, which involves a process for transferring a pattern from a template having a structured surface to a target surface of a substrate. More particularly, the invention relates to a two step process in which a replica of the template pattern is formed in or on a flexible polymer foil by imprint to obtain an intermediate polymer stamp, where after the polymer stamp is used in a secondary step to imprint the pattern in a moldable layer applied to the target surface of the substrate. In the secondary step, the imprint process makes use of radiation to solidify the moldable layer under pressure at a controlled constant temperature.

BACKGROUND

One of the most powerful techniques for reproducing nanostructures—i.e. structures in the order of 100 nm or smaller—is nanoimprint lithography (NIL). In nanoimprint lithography an inverted copy of the surface pattern of a template—often called a stamp—is transferred into an object, comprising a substrate and, applied thereto, a film of a moldable layer often called resist, e.g. a polymer material. After heating the object to a suitable temperature above the glass transition temperature of the polymer film the stamp is pressed towards the film followed by cooling and release—often called demolding—of the stamp, after the desired pattern depth has been transferred into the film. Alternatively, the substrate is covered by a photo-resist material, i.e. a polymer which is sensitive to radiation such that it is cross-linked upon exposure to ultraviolet (UV) radiation, or a pre-polymer which is cured into a polymer upon exposure to radiation. This requires that either the substrate or the stamp is transparent to the applied radiation. In a subsequently performed process after the achieved imprint, the object—comprising the substrate and the patterned polymer film—can be post-processed e.g. by etching of the substrate within the imprinted regions to transfer the pattern to a target surface of the substrate.

The imprint process described above exhibits some difficulties, which have to be considered in order to achieve a perfect pattern transfer from the template into the moldable layer covering the substrate.

If the template and the substrate are not made of the same material, which they generally are not, they will typically have different thermal expansion coefficients. This means that during heating and cooling of the template and the substrate, the extent of expansion and contraction will be different. Even though the dimensional change is small, it may be devastating in an imprint process, since the features of the pattern to be transferred are in the order of micrometers or even nanometers. The result may therefore be reduced replication fidelity.

Very often an inflexible stamp or substrate material is used, and this can lead to the inclusion of air between stamp and moldable layer when the stamp is pressed towards the substrate, also downgrading the replication fidelity. Furthermore, inclusion of particles between stamp and moldable layer during an imprint process can lead to pronounced damages of either the stamp or the substrate especially when neither the stamp nor the substrate are composed by a flexible material. Physical damage to the stamp or the substrate or both can also be caused upon demolding of an inflexible stamp from inflexible substrate, and it is difficult to demold a substrate and a template including patterns with high aspect ratio after an imprint process. A once damaged stamp is usually not recyclable.

SUMMARY OF THE INVENTION

It is an object of the invention to provide a solution for an improved imprint process, having high replication fidelity, and which is easy and suitable to employ industrially.

An embodiment of the invention, devised to fulfill the stated object, relates to a method for transferring a pattern from a template having a structured surface to a target surface of a substrate, comprising:

a primary imprint step including
  creating a polymer stamp having a patterned surface, comprising the step of pressing the structured template surface into a surface layer of a first polymer foil to imprint an inverse of the pattern in the surface layer; and
a secondary imprint step including
  arranging the polymer stamp and a substrate mutually parallel, with the patterned surface facing the target surface substrate, and with an intermediate layer of a material devised to solidify upon exposure to radiation;
  heating the polymer stamp and the substrate to a temperature $T_p$; and while maintaining said temperature $T_p$, performing the steps of:
  pressing the polymer stamp towards the substrate for imprinting the pattern of the patterned surface into said intermediate layer; and
  exposing said layer to radiation for solidifying the intermediate layer.

In one embodiment the method further comprises the step of:
  postbaking the intermediate layer while maintaining said temperature $T_p$.

In one embodiment the method further comprises the step of:
  releasing the substrate from the polymer stamp while maintaining said temperature $T_p$.

In one embodiment, the step of releasing the substrate from the polymer stamp includes the step of dissolving the polymer stamp while still being arranged in contact with the imprinted intermediate layer on the substrate.

In one embodiment, said material is a cross-linkable thermoplastic polymer having an initial glass temperature $T_g$, and wherein $T_p$ exceeds $T_g$.

In one embodiment, said material is a UV cross-linkable thermoplastic polymer having a glass temperature $T_g$, wherein temperature $T_p$ exceeds temperature $T_g$, and wherein said radiation is UV radiation.

In one embodiment, said material is photo chemically amplified.

In one embodiment, the method comprises:
  applying said intermediate layer on the substrate by spin-coating said material, prior to the step of arranging said polymer foil and substrate mutually parallel.

In one embodiment, said material is a UV-curable pre-polymer, and wherein said radiation is UV radiation.

In one embodiment, the method comprises:
   arranging the polymer foil and the substrate sandwiched between a stop member and a first side of a flexible membrane, and wherein
   the pressing of the polymer foil towards the substrate involves applying an overpressure to a medium present on a second side of the membrane.

In one embodiment, said medium comprises a gas.

In one embodiment, said medium comprises air.

In one embodiment, said medium comprises a liquid.

In one embodiment, said medium comprises a gel.

In one embodiment, the method comprises:
   emitting radiation to said intermediate layer through the polymer foil, which polymer foil is transparent to a wavelength range of a radiation usable for solidifying said material; and
   heating said substrate by direct contact with said heater device.

In one embodiment, the method comprises:
   emitting radiation to said intermediate layer through said membrane, which membrane is transparent to a wavelength range of a radiation usable for solidifying said material.

In one embodiment, the method comprises:
   emitting radiation to said layer through said membrane, and through a transparent wall opposing said membrane, defining a back wall for a cavity for said medium, which back wall and membrane are transparent to a wavelength range of a radiation usable for solidifying said material.

In one embodiment, the step of exposing said layer comprises:
   emitting radiation from a radiation source within a wavelength range of 100-500 nm.

In one embodiment, the method comprises:
   emitting pulsating radiation with a pulse duration in the range of 0.5-10 µs and a pulse rate in the range of 1-10 pulses per second.

In one embodiment, the method comprises:
   applying a vacuum between said template and said substrate in order to extract air inclusions from said surface layer prior to exposing said layer to radiation.

In one embodiment, the temperature $T_p$ is within the range of 20-250° C.

In one embodiment, the primary imprint step further includes
   solidifying the surface layer of the first polymer foil, wherein the first polymer foil is the polymer stamp and the surface layer defines the patterned surface of the polymer stamp.

In one embodiment, the primary imprint step further includes
   solidifying the surface layer of the first polymer foil;
   pressing the inverse pattern of the first polymer foil into a surface layer of a second polymer foil to imprint a replica of the pattern of the template surface in the surface layer of the second polymer foil; and
   solidifying the surface layer of the second polymer foil, wherein the second polymer foil is the polymer stamp and its surface layer defines the patterned surface of the polymer stamp.

In one embodiment, the first polymer foil is made from a thermoplastic polymer or co-polymer material.

In one embodiment, the second polymer foil is made from a thermoplastic polymer or co-polymer material.

In one embodiment, the template is made from metal, quartz, polymer or silicon.

In one embodiment, the method comprises, while maintaining temperature $T_p$:
   releasing the pressure; and
   releasing the substrate carrying the intermediate layer on the target surface, from the polymer stamp.

In one embodiment, in which the pattern of the template is transferred to a plurality of substrates, the method further comprises:
   disposing the polymer stamp after the secondary imprint step;
   creating a new polymer stamp in a repetition of the first imprint step using said template; and
   imprinting a new substrate target surface in a repetition of the second imprint step using the new polymer stamp.

In one embodiment, the first polymer foil is made from polycarbonate, COC or PMMA.

In one embodiment, the primary imprint step is a thermal imprint process including
   providing a massive polymer foil;
   heating the polymer foil to a temperature above its glass transition temperature;
   pressing the structured template surface into a surface of the polymer foil;
   cooling the polymer foil; and
   separating the patterned polymer foil from the template.

In one embodiment, the primary imprint step is a radiation-assisted imprint process including
   providing a polymer foil;
   providing a radiation-sensitive pre-polymer surface layer on a surface of the polymer foil;
   pressing the structured template surface into the surface layer;
   exposing the surface layer to radiation through the polymer foil to cure the pre-polymer; and
   separating the patterned polymer foil from the template.

In one embodiment, the primary imprint step further includes
   providing heat to post-bake the surface layer, before separating patterned polymer foil from the template.

In one embodiment, the primary imprint step is a radiation-assisted imprint process including
   providing a polymer foil;
   providing a radiation-sensitive cross-linkable polymer surface layer on a surface of the polymer foil;
   heating the polymer foil to a temperature above a glass transition temperature of the cross-linkable polymer, and while maintaining said temperature, performing the steps of:
   pressing the template towards the surface layer; and
   exposing the surface layer to radiation for cross-linking the surface layer.

In one embodiment, the primary imprint step further includes
   postbaking the surface layer while maintaining said temperature.

In one embodiment, the method further comprises the step of
   separating the patterned polymer foil from the template.

BRIEF DESCRIPTION OF THE DRAWINGS

Embodiments of the invention will be described in more detail below, with reference to the accompanying drawings, on which.

DETAILED DESCRIPTION OF PREFERRED EMBODIMENTS

Figure 1:
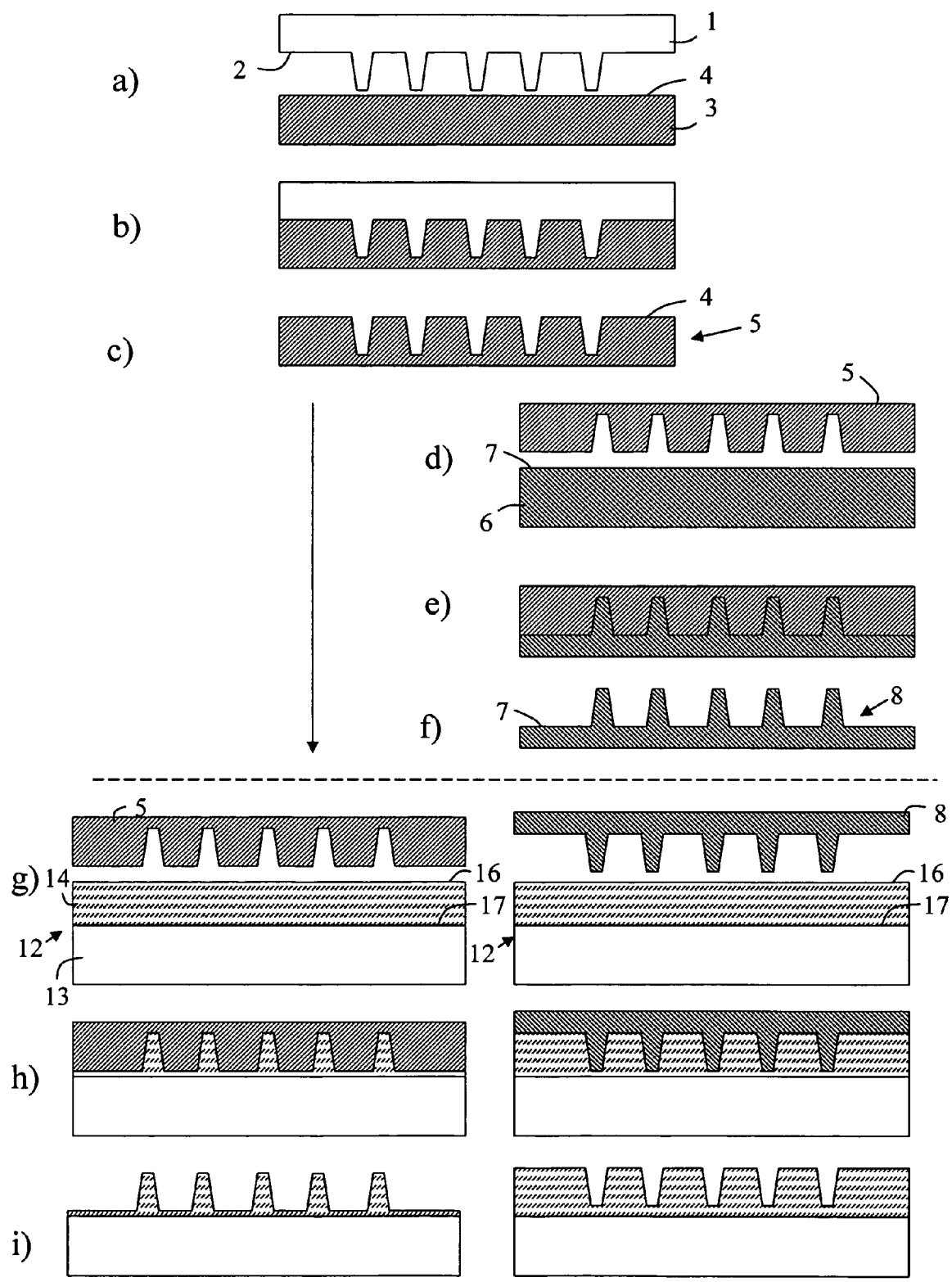
FIG. 1 schematically illustrates the two-step process to manufacture replicas from a template into an object surface according to an embodiment of the invention.

The present invention relates to what is herein referred to as a "two-step imprint process". This term is to be understood as a process in which in a first step one or more replicas of a template having a nanometer and/or micrometer size patterned surface is formed into one or more flexible polymer foils by an imprint process. The imprinted polymer foil may be used as a polymer stamp in a second step. Alternatively, the imprinted polymer foil is used as a stamp to make another imprint on another polymer foil, which is subsequently used in the second step. This way, the first step of the process may generate both negative polymer replicas, where the pattern is inverted to that of the original template, and flexible positive polymer replicas, where the pattern is similar to that of the original template. In the second step a so-produced replica can be used as a flexible polymer stamp to reproduce the pattern into an object surface through a subsequent performed imprint process employing thermal imprint, UV-imprint, or both.

The term "nano-imprinting process" or "imprint process" as used herein refers to a process for the creation of an inverted copy of a nano- and/or micro-structured surface pattern of a template or stamp, which is generated by pressing the stamp into a moldable layer, such as a polymer or pre-polymer, in order to deform the layer. The layer may be a separately coated film on top of a base or substrate, where the base and the layer may be of different materials. Alternatively, the layer may simply be a portion of a single material object, where the layer is defined as a portion stretching from a surface of the object down to a certain depth into the bulk of the object. The moldable layer may either be heated-up above its glass transition temperature $T_g$ followed by cooling-down to below said glass transition temperature during the imprinting (e.g., hot embossing) process, and/or the polymer may be cured or cross-linked with the help of UV-light exposure during or after the imprinting process. The patterned surface of the template, and of the imprinted layers, may have structures on a micrometer or nanometer scale both in terms of depth and width.

The term "flexible polymer foil" refers to a flexible and ductile in the most cases transparent foil comprising a thermoplastic polymer, a thermosetting polymer, and/or a polymer, cross-linkable after exposure to radiation. Preferred embodiments of the polymer foil include polycarbonate, polymethyl methacrylate (PMMA) and cyclo-olefin copolymer (COC).

The term "replication fidelity" refers to the creation of an inverted copy of the stamp structure in which the inverted topography of the stamp surface is completely reproduced.

In accordance with the invention, a two-step imprint process is provided, where in a first step of this two-step process, replicas of a template having a patterned surface are formed by imprint in flexible polymer foils. In a second step the replicas are used as flexible polymer stamps to reproduce the pattern into an object surface through a subsequent imprint process. In at least the second step, radiation-assisted imprint is performed at a controlled constant temperature, such that thermal expansion effects are minimized.

This way a durable and comparatively inflexible template may advantageously be used, made of a material such as a metal, quartz, silicon or other substantially inflexible material, for imprinting its pattern in a flexible polymer foil to create the polymer stamp, and the polymer stamp may then advantageously be used for imprint in a moldable layer on the target surface of the substrate. By means of the invention, the relatively hard and inflexible template is used for imprint in the relatively softer and more flexible polymer foil to create an intermediate polymer stamp, where after the relatively flexible and soft polymer stamp is used for imprint in the moldable layer on the relatively harder and less flexible substrate, which may be of e.g. silicon. An imprint step between two substantially hard and inflexible materials, such as metal and silicon or quartz and silicon is thereby advantageously avoided, with the result that the template is less worn and fewer substrates are damaged.

Furthermore, by using a polymer foil as a basis for the intermediate stamp, which is transparent to a wavelength range usable for cross-linking or in other ways solidifying a radiation-sensitive moldable layer, radiation-assisted imprint may selectively be used both for creating the polymer stamp and when using the polymer stamp for imprint on the substrate, while both the template and the substrate may be provided in materials which are not transparent to radiation of a usable wavelength range.

The template is a comparatively expensive element to produce and it is, as mentioned, generally not possible to repair or recycle a once damaged template. The polymer stamp, however, is easily manufactured from a comparatively inexpensive material in accordance with the method according to the invention, and is preferably disposed after being used a couple of times, or even only once. The polymer stamp may be demolded, or released, from the substrate and then thrown away, or it may be dissolved when still attached to the target surface of the substrate in a bath with a suitable liquid solution selected to dissolve the polymer stamp but not the substrate or the solidified moldable layer on the target surface of the substrate.

Since the created polymer stamp is used as a secondary template for imprint on the target surface of the substrate, and the substrate generally is not a polymer material, the thermal expansion coefficients of the polymer stamp and the substrate will typically differ. In order to overcome the aforementioned drawbacks resulting from such a scenario, at least the secondary imprint step where the polymer stamp is pressed into the moldable layer on the substrate is performed according to a combined radiation- and heat-assisted imprint process. According to this process, a radiation-sensitive material is used as the moldable layer on the substrate, and the steps of pressing the polymer stamp and the substrate together, flooding the moldable layer with radiation, and postbaking the layer, and preferably also the steps of releasing the pressure and demolding the polymer stamp from the substrate, are performed at an elevated constant temperature maintained by means of a temperature control device. The temperature control device typically includes a heater device and a control circuit for balancing supply of heat to obtain and maintain a determined temperature, and possibly also a cooling device.

The first, or primary, step of the two step process will now be described with reference to FIGS. 1a to 1f of the drawings. The process of the primary step according to two different embodiments are schematically illustrated in FIG. 1. The process of FIGS. 1a to 1f illustrate creation of an intermediate polymer stamp using thermal imprint. However, there are other possible techniques for creating the polymer stamp as will be outlined below.

FIG. 1a displays a template 1, composed of e.g. silicon, nickel or other metal such as aluminum, quartz, or even a polymer material. Template 1 has a patterned surface 2, comprising ribs, grooves, protrusions or recesses, having heights and widths in the order of micrometers or nanometers. The template 1 is placed with surface 2 facing and contacting a surface 4 of a flexible polymer foil 3 made of e.g. a thermoplastic polymer, a thermosetting polymer, and/or a polymer, which is cross-linkable e.g. with the help of exposure to radiation. More specific examples of suitable polymer foil materials include polycarbonate, COC and PMMA. In a preferred embodiment, template surface 2 of and surface 4 of the polymer foil 3 exhibit anti-adhesion properties against to each other, due to their material compositions or characteristics of an anti-adhesion layer provided on template surface 2 and/or polymer foil surface 4.

With the help of a suitable imprint process as illustrated in FIG. 1b) an inversion of the pattern of template surface 2 is formed into a surface layer at surface 4 of the flexible polymer foil 3. After the template surface 2 has been placed in contact with surface 4 of polymer foil 3, the polymer foil is heated to a temperature above the glass temperature $T_g$ of the used polymer in the surface layer of the foil. The polymer foil may be massive, i.e. having more or less the same composition throughout the entire polymer foil, or it may have a base composition of the actual polymer foil with an applied surface layer at surface 4 of another composition adapted for imprint. When the surface layer has reached its glass transition temperature, pressure is applied to press template 1 and polymer foil 3 together such that the pattern of surface 2 is imprinted in the surface layer at surface 4 of polymer foil 3. Pressing may be achieved by means of a soft press technique using a fluid or gas pressure supplied by means of a membrane, as will be explained in more detail with reference to the secondary step of the process according to the invention. Alternatively, a more conventional hard press technique may be used. Since the polymer stamp created in the primary step is not the final product, parallelism is not a crucial element of the primary step in the same manner as for the secondary step.

As mentioned, the illustrated embodiment makes use of thermal imprint, and polymer foil 3 is therefore heated before the pressure is applied, in order to soften the surface layer. Specific examples according to the above thermal primary step are given below. Alternative methods may alternatively or additionally include applied exposure of selected portions of the polymer foil to radiation. If the material of the polymer foil is also to be cross-linked by exposure to radiation, either the material of the template 1 or that of the polymer foil 3 must be transparent to the applied radiation. Alternative embodiments include a thermally or UV-curable pre-polymer composition in the surface layer at surface 4 of polymer foil 3. In such an embodiment heating above the glass transition temperature is not necessary.

In one example of a UV-NIL process, a UV-curable pre-polymer is dispensed at suitable positions across surface 2 of template 1, and it is afterwards covered with a polycarbonate or PMMA sheet, corresponding to foil 3 in FIG. 1. The sheet works later as UV-transparent substrate in the second imprint process. Thanks to the fact that a carrier base is provided by the sheet, which is highly transparent to UV radiation, the thickness of the actual surface layer provided by the pre-polymer layer can be kept at a minimum level of only a few nanometers. This is particularly useful when pre-polymer materials are used which do not lose their UV-absorbing property after curing, such as PAK01 from Toyo Gosei, Japan. Another usable UV-curable pre-polymers is NIF-1 from Asahi Glass Corporation Japan, but any other UV-curable pre-polymer might function just as good or better. A good UV-polymer loses its UV-absorbing properties after curing in order to increase UV-transmission in the second imprint stage. However, the combination of pre-polymer and polymer sheet should be selected with some care to avoid chemical dissolution of the sheet by the pre-polymer but having good enough interaction between those to guarantee good adhesion between them. After the substrate foil is placed on top of the dispensed pre-polymer droplets with inclusion of air bubbles, a UV-transparent polymer membrane is placed on top of the polymer sheet. This membrane is then pressurized on the opposite side with a comparably low pressure ranging from 1 to 20 bar, provided by a gas or liquid pressure, and UV-radiation of a suitable dose exposes and cures the pre-polymer through the polymer sheet and the polymer membrane thereby curing the pre-polymer and bonding it to the polymer foil. The pressure is released followed by removal of imprint membrane and demolding of the thus-created polymer stamp from the template.

In a thermal NIL-process the master is covered with a suitable polymer sheet such as Topas from Ticona, USA, or Zeonor from Zeon Corp., Japan. After placement of the imprint membrane on top of the polymer sheet the sandwich is sucked by vacuum and heated. When the imprint temperature is reached the membrane is pressurized between 20-80 bars. After pattern transfer to the polymer film the sandwich is cooled below glass transition temperature followed by removal of imprint membrane and demolding of the IPS stamp from the master. A good thermoplastic sheet needs to have a narrow process window regarding imprint temperature and release temperature as well as high mechanical strength of the generated nanometer structures that have to serve as mold in the subsequent process. A high deegree of transparency for UV-radiation is highly beneficial.

In an example of a combined heat and radiation the polymer foil, corresponding to 3 in FIG. 1, to which the template pattern is to be transferred needs to be UV-transparent. A UV-cross-linkable polymer, e.g. a negative photoresist such as SU8 from MicroChem, USA, is spin-coated onto the polymer foil. the template 1 and the coated polymer foil are brought together and covered by an imprint membrane over the polymer foil. After heating to the imprint temperature the latter is held constant during the entire rest of the imprint process to eliminate thermal expansion effects. The sandwich is now pressurized and after a typical flow time, e.g. 30 seconds, the polymer is cross-liked by UV-radiation followed by a post exposure bake of e.g. 30 seconds. No cooling is required, and the pressure can now be released directly followed by removal of imprint membrane and demolding. Again, a good negative photoresist loses its UV-absorbing properties after exposure.

Dependent on the specific process used, i.e. thermal, UV or combined thermal and UV at constant temperature, template 1 and the imprinted polymer foil 3 can be separated either after cooling or without cooling of the polymer foil after the performed imprint process depending on the chosen material and its properties. After release of the template 1 from the polymer surface 4, the imprinted polymer foil 3, also called the replica, displayed in FIG. 1*c*) having a pattern in its surface 4 which is inverted or negative to that of the original template 1, can be used as a flexible polymer stamp 5.

In accordance with the invention, polymer stamp 5 is either used in the secondary step to transfer the pattern of surface 4 to a target substrate, or it is used in an additional primary step to produce a second inversed replica 9 into another flexible polymer foil 6 according to FIGS. 1*d*) to 1*f*), in a similar process as described above. A purpose behind employing a further primary step is to ensure that the final pattern to be created in the target substrate is to be an inverse of the template surface pattern. In such an embodiment, a polymer foil 6 is used which is be composed by a polymer, whose glass transition temperature and imprint temperature is lower than that of the flexible polymer stamp 5. Furthermore, the engaging surfaces 4 and 7 of polymer foil 6 and flexible polymer stamp 5 exhibit anti-adhesion properties against to each other. Anti-adhesion properties could be present from the beginning due to the chemical nature of the used polymer foils and/or be implemented by the deposition of anti-adhesion layers comprising suitable release agents on one or both polymer surfaces. Additionally, if the polymer foil 6 should be cross-linked after exposure to radiation at least one of the polymer foils 5 and 6 must be transparent to the applied radiation or alternatively transmit enough radiation to enable a cross-linking of the surface layer of foil 6, or the entire foil 6 if it is massive.

Creation of a new polymer stamp 8, which is inverted from the first polymer stamp 5 and thus substantially identical to template 1, with regard to the pattern, includes placing polymer stamp 5 with its patterned surface 4 facing and in contact with a surface 7 of the second polymer foil 6. As before, second polymer foil 6 may be massive or have a carrier sheet to which a surface layer is applied at surface 7. In order to be able to imprint the pattern of surface 4 in the surface layer of foil 6, foil 6 is heated above the glass transition temperature of its surface layer if a thermal imprint process is used. As shown in FIG. 1*e*), pressure is then applied to press the first polymer stamp 5 into the surface layer of polymer foil 6. After performed imprint the flexible polymer stamp 5 can be removed from the polymer foil 6 mechanically, i.e. mostly after cooling the polymer foil 9, or alternatively the whole stamp 5 or portions of it can be dissolved chemically with the help of one or more suitable solvents in a suitable process. The result is a new polymer stamp 8 with a surface 7 having a pattern corresponding to that of the original template 1.

The so-produced replicas 5 or 8 having inverted or identical surface patterns to that of the original template 1, respectively, will be used as flexible polymer templates in a secondary imprint step according to the invention, as schematically illustrated in FIGS. 1*g*) to 1*i*) on the left hand side and the right hand side, respectively. Here, surfaces 4 or 7 of one of the flexible polymer stamps 5 or 8 will be placed in contact with a surface 16 of an object 12 comprising a substrate 13 having a target surface 17 covered by a thin moldable surface layer 14 of a radiation-sensitive material, e.g. a pre-polymer or a polymer which is cross-linkable with the help of the exposure to radiation. Surface 4 or 7 of the flexible polymer stamp 5 or 8 exhibit anti-adhesion properties against surface 16 of the moldable layer 14, due to the material compositions of the surfaces. With the help of an applied pressure forcing one of the flexible polymer templates 5 or 8 and object 12 together and applied exposure of selected portions of the polymer film 14 to radiation, an inversion of the pattern of the polymer stamp surfaces is formed in the moldable layer 14, as shown in FIG. 1*h*. The flexible polymer stamp 5 or 8 is transparent to the applied radiation or shows minor absorbance in order to transmit a sufficient amount of radiation necessary for curing or cross-linking the material of surface layer 14 upon exposure to radiation. After performed imprint and post-baking as shown in FIG. 1*h*), the flexible polymer stamp 5 or 8 can be removed from the substrate 13 mechanically or, alternatively the whole polymer stamp 5 or 8 or portions of it can be dissolved chemically with the help of one or more suitable solvents in a suitable process.

FIG. 1*i*) shows the resulting imprinted object 12 after release of the flexible polymer stamp 5 or 8. In order to permanently affix the transferred pattern to the substrate, further processing steps are typically employed to remove the thinnest portions of the remaining film 14 to expose the target surface 17 of the substrate, and then to either etch the target surface or plate it with another material. The actual details of this further processing are not important for understanding of the invention, though.

FIG. 1 is a relatively simple representation of the process according to the invention. The primary step, depicted above the dashed line, may be performed using thermal imprint directly in the massive polymer foil, UV-assisted imprint using a pre-polymer surface layer on the polymer foil, or simultaneous UV radiation at a controlled elevated temperature using a UV cross-linkable polymer surface layer on the polymer foil. If thermal imprint is used in steps 1*a*) to 1*c*), there will typically be a difference in the thermal expansion between template 1, which e.g. may be nickel, and the polymer foil 3. However, the resiliency and flexibility of polymer foil 3, which furthermore has a thickness which is substantially larger than the height of the pattern structures, guarantees that the polymer foil is stretched and contracted by the thermal expansion imposed on template 1, without damaging the pattern features on the foil surface 4. The thickness of the polymer foil is typically in the range of 50-500 µm, whereas the height or depth of the pattern structures is in the range of 5 nm to 20 µm, as will be shown by means of examples below. Other sizes are possible though.

However, the second step depicted below the dashed line in FIG. 1 is preferably performed using combined heat and radiation. The reason for this is that when imprint is to be performed on the substrate, the remaining or residual surface layer on the target surface of the substrate is generally extremely thin, in the order of a few nanometers. Heating and cooling a sandwiched pair of stamp and polymer having different thermal expansion, will therefore often be devastating to fine structures, which tend to be completely ripped off. However, thanks to the process according to the invention, where the steps of pressing, radiating and postbaking are all performed at a controlled constant temperature, thermal expansion effects are eliminated.

Figure 5:
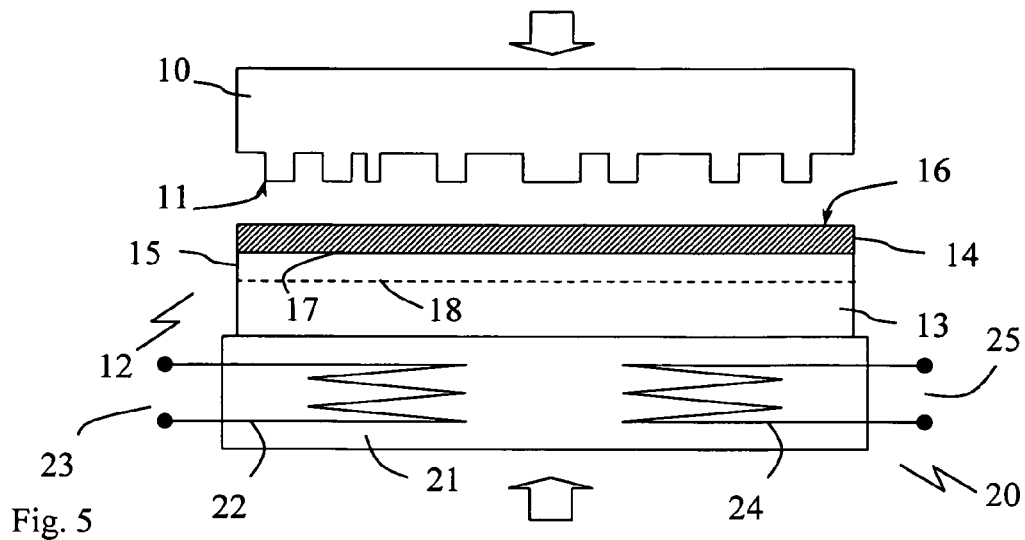
FIGS. 5-7 illustrates process steps of an embodiment of the invention.
Figure 6:
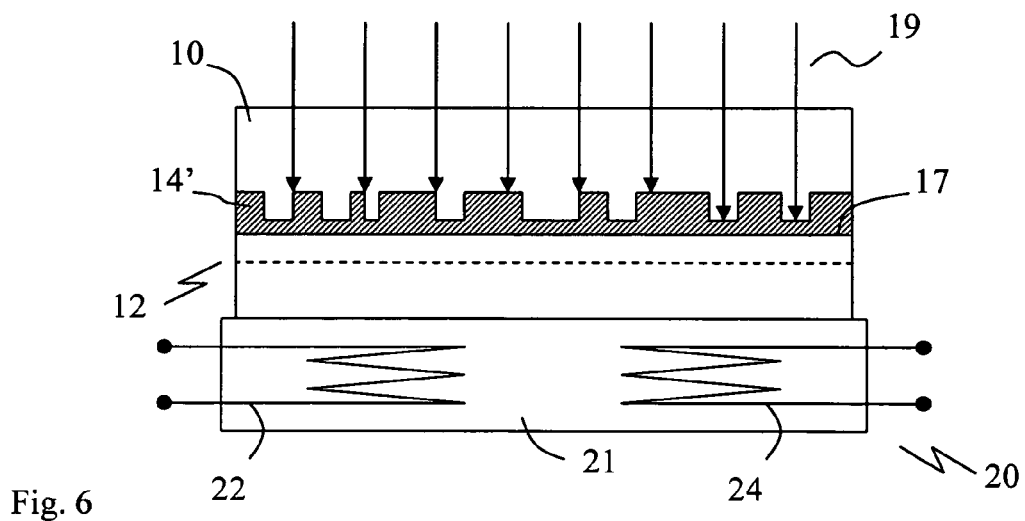
Figure 7:
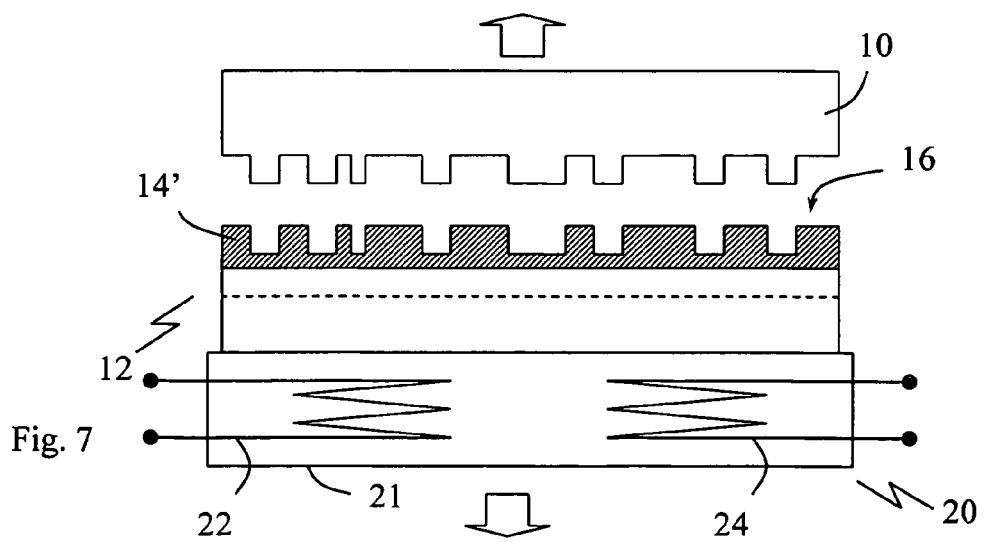

FIGS. 5-7 schematically present the basic process steps of the actual pattern transfer steps, or imprint steps, in the secondary step of an embodiment of the invention. These drawings correspond to FIGS. 1*g*) to 1*h*), either the left hand side example or the right hand side example, but in greater detail.

In FIG. 5 a polymer stamp 10 is illustrated, which consequently may correspond to either polymer stamp 5 or 8 in FIG. 1. Polymer stamp 10 has a structured surface 11, corresponding to surface 4 or 7, with a predetermined pattern to be transferred, in which three-dimensional protrusions and recesses are formed with a feature size in height and width within a range of 1 nm to several µm, and potentially both smaller and larger. The thickness of polymer stamp 10 is typically between 10 and 1000 µm. A substrate 12 has a target surface 17 which is arranged substantially parallel to polymer stamp surface 11, with an intermediate spacing between the surfaces at the initial stage shown in FIG. 5. The substrate 12 comprises a substrate base 13, to which the pattern of polymer stamp surface 11 is to be transferred. Though not shown, the substrate may also include a support layer below the substrate base 13. In a process where the pattern of polymer stamp 10 is to be transferred to substrate 12 directly through an imprint in a polymer material, said material may be applied as a surface layer 14 directly onto the substrate target surface 17. In alternative embodiments, indicated by the dashed line, a transfer layer 15 is also employed, of e.g. a second polymer material. Examples of such transfer layers, and how they are used in the subsequent process of transferring the imprinted pattern to the substrate base 13, are described in U.S. Pat. No. 6,334,960. In an embodiment including a transfer layer 15, target surface 17 denotes the upper or outer surface of the transfer layer 15, which in turn is arranged on the substrate base surface 18.

Substrate 12 is positioned on a heater device 20. Heater device 20 preferably comprises a heater body 21 of metal, e.g. aluminum. A heater element 22 is connected to or included in heater body 21, for transferring thermal energy to heater body 21. In one embodiment, heater element 22 is an electrical immersion heater inserted in a socket in heater body 21. In another embodiment, an electrical heating coil is provided inside heater body 21, or attached to a lower surface of heater body 21. In yet another embodiment, heating element 22 is a formed channel in heater body 21, for passing a heating fluid through said channel. Heater element 22 is further provided with connectors 23 for connection to an external energy source (not shown). In the case of electrical heating, connectors 23 are preferably galvanic contacts for connection to a current source. For an embodiment with formed channels for passing a heating fluid, said connectors 23 are preferably conduits for attachment to a heated fluid source. The heating fluid may e.g. be water, or an oil. Yet another option is to employ an IR radiation heater as a heater element 22, devised to emit infrared radiation onto heater body 21. Furthermore, a temperature controller is included in heater device 20 (not shown), comprising means for heating heater element 22 to a selected temperature and maintaining that temperature within a certain temperature tolerance. Different types of temperature controllers a well known within the art, and are therefore not discussed in further detail.

Heater body 21 is preferably a piece of cast metal, such as aluminum, stainless steel, or other metal. Furthermore, a body 21 of a certain mass and thickness is preferably used such that an even distribution of heat at an upper side of heater device 20 is achieved, which upper side is connected to substrate 12 for transferring heat from body 21 through substrate 12 to heat layer 14. For an imprint process used to imprint 2.5" substrates, a heater body 21 of at least 2.5" diameter, and preferably 3" or more, is used, with a thickness of at least 1 cm, preferably at least 2 or 3 cm. For an imprint process used to imprint 6" substrates, a heater body 21 of at least 6" diameter, and preferably 7" or more, is used, with a thickness of at least 2 cm, preferably at least 3 or 4 cm. Heater device 20 is preferably capable of heating heater body 21 to a temperature of up to 200-300° C., though lower temperatures will be sufficient for most processes.

For the purpose of providing controlled cooling of layer 14, heater device 20 may further be provided with a cooling element 24 connected to or included in heater body 21, for transferring thermal energy from heater body 21. In a preferred embodiment, cooling element 24 comprises a formed channel or channels in heater body 21, for passing a cooling fluid through said channel or channels. Cooling element 24 is further provided with connectors 25 for connection to an external cooling source (not shown). Preferably, said connectors 25 are conduits for attachment to a cooling fluid source. Said cooling fluid is preferably water, but may alternatively be an oil, e.g. an insulating oil.

A preferred embodiment of the invention makes use of a radiation cross-linkable thermoplastic polymer solution material for layer 14, which preferably is spin-coatable. These polymer solutions may also be photo chemically amplified. An example of such a material is mr-L6000.1 XP from Micro Resist Technology, which is UV cross-linkable. Other examples of such radiation cross-linkable materials are negative photoresist materials like Shipley ma-N 1400, SC100, and MicroChem SU-8. A material which is spin-coatable is advantageous, since it allows complete and accurate coating of an entire substrate.

Another embodiment makes use of a liquid or near liquid pre-polymer material for layer 14, which is polymerizable by means of radiation. Examples of available and usable polymerizable materials for layer 14 comprise NIP-K17, NIP-K22, and NIP-K28 from ZEN Photonics, 104-11 Moonj i-Dong, Yusong-Gu, Daejeon 305-308, South Korea. NIP-K17 has a main component of acrylate, and has a viscosity at 25° C. of about 9.63 cps. NIP-K22 also has a main component of acrylate, and a viscosity at 25° C. of about 5.85 cps. These substances are devised to cure under exposure to ultraviolet radiation above 12 mW/cm$^2$ for 2 minutes. Another example of an available and usable polymerizable material for layer 14 is Ormocore from Micro Resist Technology GmbH, Koepenicker Strasse 325, Haus 211, D-12555 Berlin, Germany. This substance has a composition of inorganic-organic hybrid polymer, unsaturated, with a 1-3% photopolymerisation initiator. The viscosity of 3-8 mPas at 25° C. is fairly high, and the fluid may be cured under exposure of radiation with 500 mJ/cm$^2$ at a wavelength of 365 nm. Other usable materials are mentioned in U.S. Pat. No. 6,334,960.

Common for all these materials, and any other material usable for carrying out the invention, is that they are moldable and have the capability to solidify when exposed to radiation, particularly UV radiation, e.g. by cross-linking of polymer solution materials or curing of pre-polymers.

The thickness of layer 14 when deposited on the substrate surface is typically 10 nm-10 µm, depending on application area. The curable or cross-linkable material is preferably applied in liquid form onto substrate 12, preferably by spin coating, or optionally by roller coating, dip coating or similar. One advantage with the present invention compared to prior art step and flash methods, typically when using a cross-linkable polymer material, is that the polymer material may be spin coated on the entire substrate, which is an advantageous and fast process offering excellent layer evenness. Cross-linkable materials, such as those mentioned, are typically solid at normal room temperature, and a substrate which has been pre-coated at an elevated temperature may therefore conveniently be used. The step and flash method, on the other hand, has to use repeated dispensation on repeated surface portions, since that method is incapable of handling large surfaces in single steps. This makes both the step and flash process and the machine for carrying out such a process complex, time consuming in terms of cycle time, and hard to control.

According to the invention, the process steps of imprinting, solidifying the imprint layer material by radiation, and postbaking the material, are performed at a constant temperature.

The arrows of FIG. 5 illustrate that the polymer stamp surface 11 is pressed into surface 16 of the moldable material layer 14. At this step, heater device 20 is preferably used to control the temperature of layer 14, for obtaining a suitable fluidity in the material of layer 14. For a cross-linkable material of layer 14, heater device 20 is therefore controlled to heat layer 14 to a temperature $T_p$ exceeding the glass temperature $T_g$ of the material of layer 14. In this context, $T_p$ stands for process temperature or imprint temperature, indicating that it is one temperature level common for the process steps of imprint, exposure, and postbaking. The level of constant temperature $T_p$ is of course dependent on the type of material chosen for layer 14, since it must exceed the glass transition temperature $T_g$ for the case of a cross-linkable material and also be suitable for postbaking the radiation-cured material of the layer. For radiation cross-linkable materials $T_p$ typically ranges within 20-250° C., or even more often within 50-250° C. For the example of mr-L6000.1 XP, successful tests have been performed with a constant temperature throughout imprint, exposure and postbake of 100-120° C. For embodiments using radiation-curable pre-polymers, such materials are typically liquid or near liquid in room temperature, and therefore need little or no heating to become soft enough for imprinting. However, also these materials must generally go through post-baking for complete hardening after exposure, prior to separation from the polymer stamp. The process temperature $T_p$ is therefore set to a suitable post-baking temperature level already in the imprint step beginning at the step of FIG. 5.

FIG. 6 illustrates how the structures of polymer stamp surface 11 has made an imprint in the material layer 14, which is in fluid or at least soft form, at which the fluid has been forced to fill the recesses in polymer stamp surface 11. In the illustrated embodiment, the highest protrusions in polymer stamp surface 11 do not penetrate all the way down to substrate surface 17. This may be beneficial for protecting the substrate surface 17, and particularly the polymer stamp surface 11, from damage. However, in alternative embodiments, such as one including a transfer layer, imprint may be performed all the way down to transfer layer surface 17. In the embodiment illustrated in FIGS. 5-7, the polymer stamp is made from a material which is transparent to radiation 19 of a predetermined wavelength or wavelength range, which is usable for solidifying a selected moldable material. Such materials may e.g. be polycarbonate, COC or PMMA. For polymer stamps created using radiation as described above, the remaining layer of the radiation-sensitive surface layer in which the pattern is formed is preferably also transparent to UV radiation, or alternatively so thin that its UV absorption is low enough to let through a sufficient amount of radiation. Radiation 19 is typically applied when polymer stamp 10 has been pressed into layer 14 with a suitable alignment between polymer stamp 10 and substrate 12. When exposed to this radiation 19, solidification of the moldable material is initiated, for solidification to a solid body 14' taking the shape determined by the polymer stamp 10. During the step of exposing layer 14 to radiation, heater 20 is controlled by the temperature controller to maintain the temperature of layer 14 at temperature $T_p$.

After exposure to radiation, a postbaking step is performed, to completely harden the material of layer 14'. In this step, heater device 20 is used to provide heat to layer 14', for baking layer 14' to a hardened body before separation of polymer stamp 10 and substrate 12. Furthermore, postbaking is performed by maintaining the aforementioned temperature $T_p$. This way, polymer stamp 10 and material layer 14, 14' will maintain the same temperature from the beginning of solidification of material 14 by exposure to radiation, to finalized postbaking, and optionally also through separation of polymer stamp 10 and substrate 12. This way, accuracy limitations due to differences in thermal expansion in any of the materials used for the substrate and the polymer stamp are eliminated.

The polymer stamp 10 is e.g. removed by a peeling and pulling process, as illustrated in FIG. 7. The formed and solidified polymer layer 14' remains on the substrate 12. The various different ways of further processing of the substrate and its layer 14' will not be dealt with here in any detail, since the invention as such is neither related to such further processing, nor is it dependent on how such further processing is achieved. Generally speaking, further processing for transferring the pattern of polymer stamp 10 to the substrate base 13 may e.g. include etching or plating followed by a lift-off step.

Figure 8:
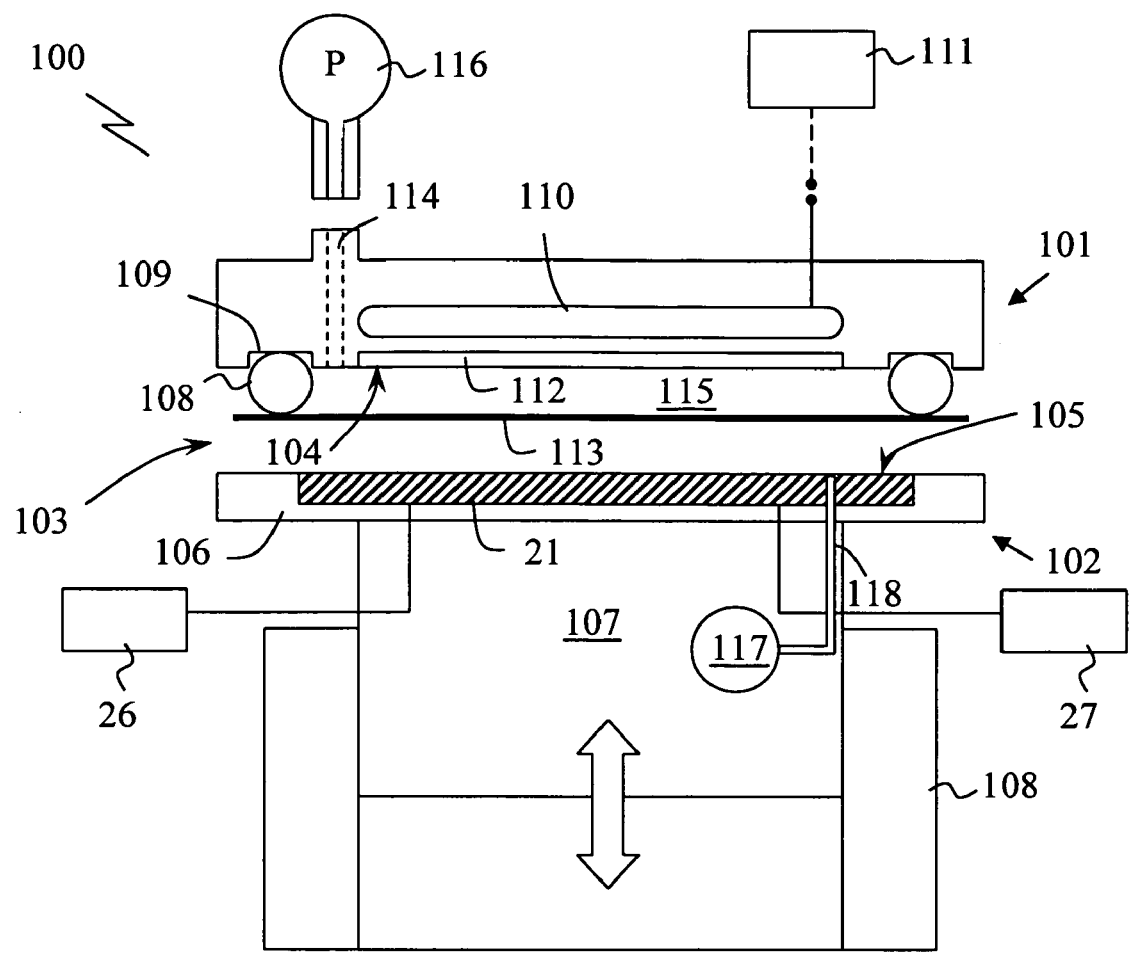
FIG. 8 schematically illustrates an embodiment of an apparatus according to the invention, for performing the process as generally described in FIGS. 1-3 or 5-7.

FIG. 8 schematically illustrates a preferred embodiment of an apparatus according to the present invention, also usable for carrying out an embodiment of the method according to the present invention. It should be noted that this drawing is purely schematic, for the purpose of clarifying the different features thereof. In particular, dimensions of the different features are not on a common scale. The apparatus is particularly useful for carrying out the secondary step of the present invention, but may equally well be used for carrying out the primary step.

The apparatus 100 comprises a first main part 101 and a second main part 102. In the illustrated preferred embodiment these main parts are arranged with the first main part 101 on top of second main part, with an adjustable spacing 103 between said main parts. When making a surface imprint by a process as illustrated in FIGS. 5-7, it may be of great importance that the template and the substrate are properly aligned in the lateral direction, typically called the X-Y plane. This is particularly important if the imprint is to be made on top of or adjacent to a previously existing pattern in the substrate. However, the specific problems of alignment, and different ways of overcoming them, are not addressed herein, but may of course be combined with the present invention when needed.

The first, upper, main part 101 has a downwards facing surface 104, and the second, lower, main part 102 has an upwards facing surface 105. Upwards facing surface 105 is, or has a portion that is, substantially flat, and which is placed on or forms part of a plate 106 which acts as a support structure for a template or a substrate to be used in an imprint process, as will be more thoroughly described in conjunction with FIGS. 9 and 10. A heater body 21 is placed in contact with plate 106, or forms part of plate 106. Heater body 21 forms part of a heater device 20, and includes a heating element 22 and preferably also a cooling element 24, as shown in FIGS. 5-7. Heating element 22 is connected through connectors 23 to a energy source 26, e.g. an electrical power supply with current control means. Furthermore, cooling element 24 is connected through connectors 25 to a cooling source 27, e.g. a cooling fluid reservoir and pump, with control means for controlling flow and temperature of the cooling fluid.

Means for adjusting spacing 103 are, in the illustrated embodiment, provided by a piston member 107 attached at its outer end to plate 106. Piston member 107 is displaceably linked to a cylinder member 108, which preferably is held in fixed relation to first main part 101. As is indicated by the arrow in the drawing, the means for adjusting spacing 103 are devised to displace second main part 102 closer to or farther from first main part 101, by means of a movement substantially perpendicular to the substantially flat surface 105, i.e. in the Z direction. Displacement may be achieved manually, but is preferably assisted by employing either a hydraulic or pneumatic arrangement. The illustrated embodiment may be varied in a number of ways in this respect, for instance by instead attaching plate 106 to a cylinder member about a fixed piston member. It should further be noted that the displacement of second main part 102 is mainly employed for loading and unloading the apparatus 100 with a template and a substrate, and for arranging the apparatus in an initial operation position. The movement of second main part 102 is, however, preferably not included in the actual imprint process as such in the illustrated embodiment, as will be described.

First main part 101 comprises a peripheral seal member 108, which encircles surface 104. Preferably, seal member 108 is an endless seal such as an o-ring, but may alternatively be composed of several interconnected seal members which together form a continuous seal 108. Seal member 108 is disposed in a recess 109 outwardly of surface 104, and is preferably detachable from said recess. The apparatus further comprises a radiation source 110, in the illustrated embodiment disposed in the first main part 101 behind surface 104. Radiation source 110 is connectable to a radiation source driver 111, which preferably comprises or is connected to a power source (not shown). Radiation source driver 111 may be included in the apparatus 100, or be an external connectable member. A surface portion 112 of surface 104, disposed adjacent to radiation source 110, is formed in a material which is transparent to radiation of a certain wavelength or wavelength range of radiation source 110. This way, radiation emitted from radiation source 110 is transmitted towards spacing 103 between first main part 101 and second main part 102, through said surface portion 112. Surface portion 112, acting as a window, may be formed in available fused silica, quartz, or sapphire.

One embodiment of the apparatus 100 according to the invention further comprises mechanical clamping means, for clamping together a substrate and a stamp (not shown). This is particularly preferred in an embodiment with an external alignment system for aligning substrate and stamp prior to pattern transfer, where the aligned stack comprising the stamp and the substrate has to be transferred into the imprint apparatus.

In operation, apparatus 100 is further provided with a flexible membrane 113, which is substantially flat and engages seal member 108. In a preferred embodiment, seal member 113 is a separate member from seal member 108, and is only engaged with seal member 108 by applying a counter pressure from surface 105 of plate 106, as will be explained. However, in an alternative embodiment, membrane 113 is attached to seal member 108, e.g. by means of a cement, or by being an integral part of seal member 108. Furthermore, in such an alternative embodiment, membrane 113 may be firmly attached to main part 101, whereas seal 108 is disposed outwardly of membrane 113. For an embodiment such as the one illustrated, also membrane 113 is formed in a material which is transparent to radiation of a certain wavelength or wavelength range of radiation source 110. This way, radiation emitted from radiation source 110 is transmitted into spacing 103 through said cavity 115 and its boundary walls 104 and 113. Examples of usable materials for membrane 113, for the embodiment of FIGS. 7-9, include polycarbonate, polypropylene, polyethylene, PDMS and PEEK. The thickness of membrane 113 may typically be 10-500 μm.

The apparatus 100 further preferably comprises means for applying a vacuum between stamp and substrate in order to extract air inclusions from the moldable layer of the stacked sandwich prior to hardening of the layer through UV irradiation. This is exemplified in FIG. 8 by a vacuum pump 117, communicatively connected to the space between surface 105 and membrane 113 by a conduit 118.

A conduit 114 is formed in first main part 101 for allowing a fluid medium, either a gas, a liquid or a gel, to pass to a space defined by surface 104, seal member 108 and membrane 113, which space acts as a cavity 115 for said fluid medium. Conduit 114 is connectable to a pressure source 116, such as a pump, which may be an external or a built in part of apparatus 100. Pressure source 116 is devised to apply an adjustable pressure, in particular an overpressure, to a fluid medium contained in said cavity 115. An embodiment such as the one illustrated is suitable for use with a gaseous pressure medium. Preferably, said medium is selected from the group containing air, nitrogen, and argon. If instead a liquid medium is used, it is preferred to have the membrane attached to seal member 108. Such a liquid may be a hydraulic oil. Another possibility is to use a gel for said medium.

Figure 9:
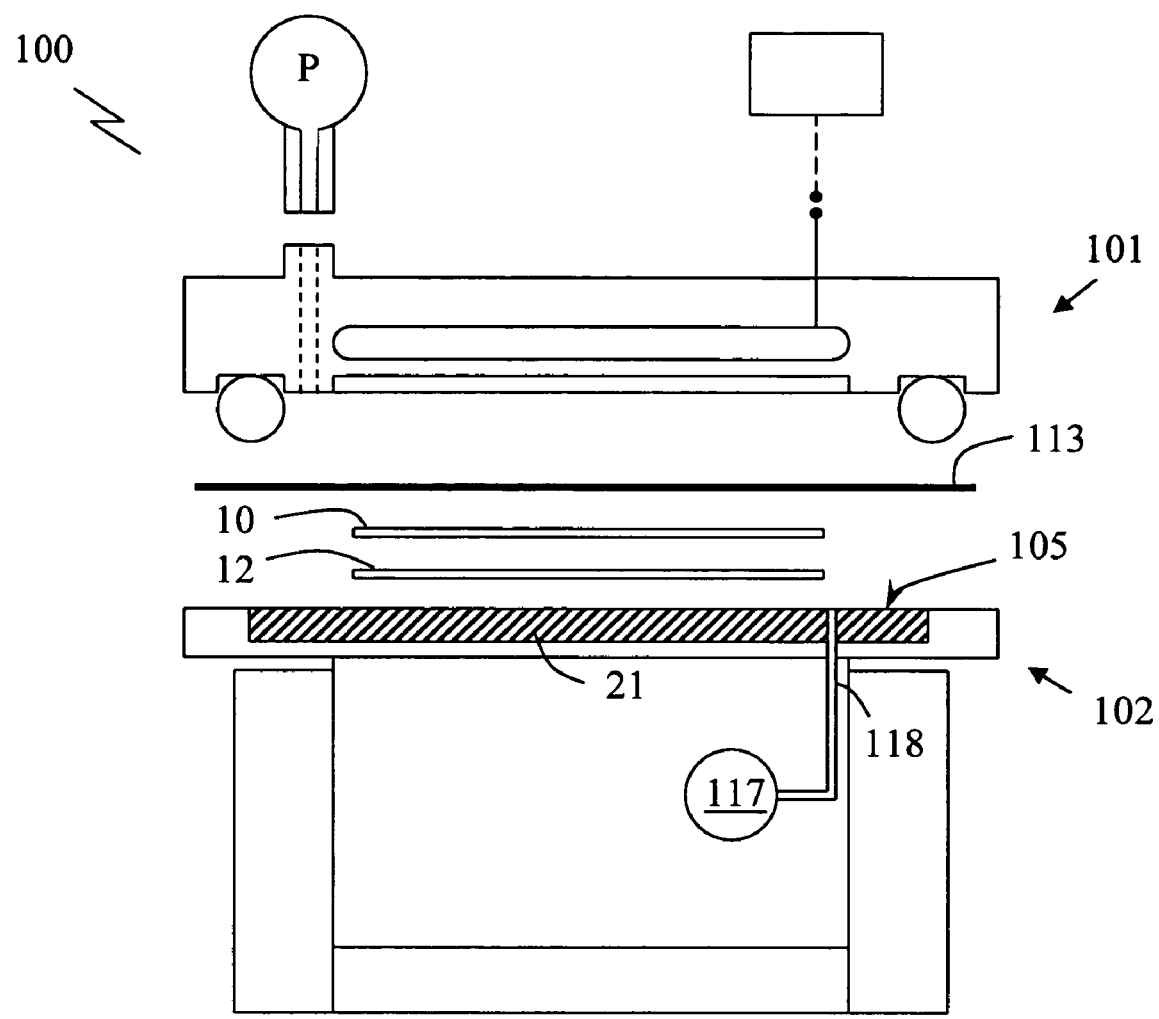
FIG. 9 schematically illustrates the apparatus of FIG. 8, when loaded with a polymer stamp and a substrate at an initial step of the process.

FIG. 9 illustrates the apparatus embodiment of FIG. 8, when being loaded with a substrate 12 and a polymer stamp 10 for a lithographic process. For better understanding of this drawing, reference is also made to FIGS. 5-7. Second main part 102 has been displaced downwards from first main part 101, for opening up spacing 103. The illustrated embodiment of FIG. 8 shows an apparatus loaded with a transparent polymer stamp 10 on top of a substrate 12. Substrate 12 is placed with a backside thereof on surface 105 of heater body 21, placed on or in the second main part 102. Thereby, substrate 12 has its target surface 17 with the layer 14 of a polymerizable material, e.g. a UV cross-linkable polymer solution, facing upwards. For the sake of simplicity, all features of heater device 20, as seen in FIGS. 5-7 are not shown in FIG. 9. Polymer stamp 10 is placed on or adjacent to substrate 12, with its structured surface 11 facing substrate 12. Means for aligning polymer stamp 10 with substrate 12 may be provided, but are not illustrated in this schematic drawing. Membrane 113 is then placed on top of polymer stamp 10. For an embodiment where membrane 113 is attached to the first main part, the step of actually placing membrane 113 on the polymer stamp is, of course, dispensed with. In FIG. 9 polymer stamp 10, substrate 12 and membrane 113 are shown completely separated for the sake of clarity only, whereas in a real situation they would be stacked on surface 105.

Figure 10:
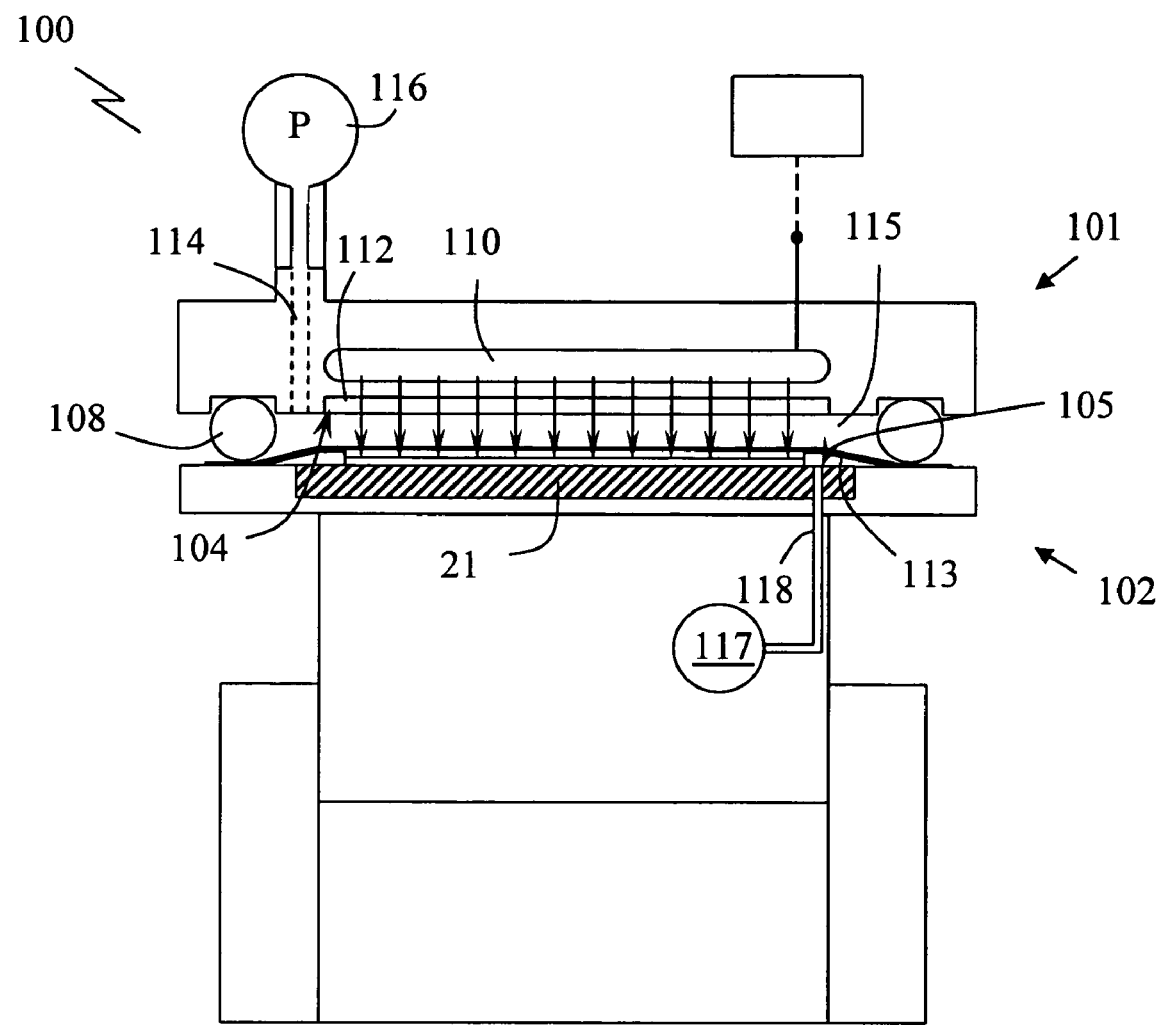
FIG. 10 illustrates the apparatus of FIGS. 8 and 9, at an active process step of transferring a pattern from the template to the substrate.

FIG. 10 illustrates an operative position of apparatus 100. Second main part 102 has been raised to a position where membrane 113 is clamped between seal member 108 and surface 105. In reality, both polymer stamp 10 and substrate 12 are very thin, typically only parts of a millimeter, and the actual bending of membrane 113 as illustrated is minimal. Still, surface 105 may optionally be devised with a raised peripheral portion at the point where it contacts seal member 108 through membrane 113, for compensating for the combined thickness of polymer stamp 10 and substrate 12.

Once main parts 101 and 102 are engaged to clamp membrane 113, cavity 115 is sealed. Vacuum is applied by suction from vacuum pump 117 to extract air inclusions from the surface layer of the substrate 12. Pressure source 116 is then devised to apply an overpressure to a fluid medium in cavity 115, which may be a gas, a liquid or a gel. The pressure in cavity 115 is transferred by membrane 113 to polymer stamp 10, which is pressed towards substrate 12 for imprinting the polymer stamp pattern in layer 14, cf. FIG. 6. Cross-linkable polymer solutions typically need pre-heating to overcome its glass transition temperature $T_g$, which may be about 60° C. An example of such a polymer is the afore mr-L6000.1 XP. When using such polymers, the apparatus 100, having combined radiation and heating capabilities, is particularly useful. However, for both these types of materials a post-baking step is generally needed to harden the radiation-solidified layer 14'. As previously mentioned, an aspect of the invention is therefore to apply a raised temperature $T_p$ to the material of layer 14, which is higher than $T_g$ for the case of a cross-linkable material, and also suitable for postbaking of the radiation-exposed material. Heater device 20 is activated to heat layer 14 through substrate 12, by means of heater body 21, until $T_p$ has been reached. The actual value of $T_p$ is naturally dependent on the material chosen for layer 14. For the example of mr-L6000.1 XP, a temperature $T_p$ within the range of 50-150° C. may be used, dependent on the molecular weight distribution in the material. The pressure of the medium in cavity 115 is then increased to 5-500 bar, advantageously to 5-200 bar, and preferably to 20-100 bar. Polymer stamp 10 and substrate 12 are thereby pressed together with a corresponding pressure. Thanks to flexible membrane 113, an absolutely even distribution of force is obtained over the whole of the contact surface between the substrate and the polymer stamp. The polymer stamp and the substrate are thereby made to arrange themselves absolutely parallel in relation to one another and, the influence of any irregularities in the surface of the substrate or polymer stamp being eliminated.

When polymer stamp 10 and substrate 12 have been brought together by means of the applied fluid medium pressure, radiation source is triggered to emit radiation 19. The radiation is transmitted through surface portion 112, which acts as a window, through cavity 115, membrane 113, and polymer stamp 10. The radiation is partly or completely absorbed in layer 14, the material of which thereby is solidified by cross-linking or curing in the perfectly parallel arrangement between polymer stamp 10 and substrate 12, provided by the pressure and membrane assisted compression. Radiation exposure time is dependent on the type and amount of material in layer 14, the radiation wavelength combined with the type of material, and of the radiation power. The feature of solidifying such a polymerizable material is well known as such, and the relevant combinations of the mentioned parameters are likewise known to the skilled person. Once the fluid has solidified to form a layer 14', further exposure has no major effect. However, after exposure the material of layer 14' is allowed to post bake, or hard bake, at the predetermined constant temperature $T_p$ for a certain time period of e.g. 1-10 minutes, if postbaking is at all necessary to solidify the layer. For the example of mr-L6000.1 XP, postbaking is typically performed for 1-10 minutes, preferably about 3 minutes, at the common process temperature $T_p$ of 100-120° C. For SU8, the time of exposure to radiation is between 1 and 10 seconds, where the range of 3-5 seconds has been successfully tested, and postbaking is then performed at a $T_p$ of about 70° C. for 30-60 seconds.

With the apparatus 100 according to the present invention, post-baking is performed in the imprint machine 100, which means that it is not necessary to bring the substrate out of the apparatus and into a separate oven. This saves one process step, which makes both time and cost savings possible in the imprint process. By performing the post-baking step while the polymer stamp 10 is still held at a constant temperature $T_p$, and potentially also with the selected pressure towards substrate 10, and, higher accuracy in the resulting structure pattern in layer 14 is also achieved, which makes it possible to produce finer structures. Following compression, exposure and post-baking, the pressure in cavity 115 is reduced and the two main parts 101 and 102 are separated from one another. After this, the substrate is separated from the polymer stamp and subjected to further treatment according to what is previously known for imprint lithography.

A first mode of the invention involves a substrate 12 of silicon covered by a layer 14 of NIP-K17 with a thickness of 1 µm. After compression by means of membrane 113 with a pressure of 5-100 bar for about 30 seconds, radiation source 110 is turned on. Radiation source 110 is typically devised to emit at least in the ultraviolet region below 400 nm. In a preferred embodiment, an air-cooled xenon lamp with an emission spectrum ranging from 200-1000 nm is employed as the radiation source 110. The preferred xenon type radiation source 110 provides a radiation of 1-10 W/cm$^2$, and is devised to flash 1-5 µs pulses, with a pulse rate of 1-5 pulses per second. A window 112 of quartz is formed in surface 104 for passing through radiation. Exposure time is preferably between 1-30 seconds, for polymerizing fluid layer 14 into a solid layer 14', but may be up to 2 minutes.

Tests with mr-L6000.1 XP have been performed with about 1.8 W/cm$^2$ integrated from 200-1000 nm, with 1 minute exposure time. It should, in this context, be noted that the radiation used need not be restricted to a wavelength range within which the polymer applied in layer 14 solidifies, radiation outside that range may of course also be emitted from the radiation source used. After successful exposure and subsequent postbaking at a constant process temperature, second main part 102 is lowered to a position similar to that of FIG. 9, following which template 10 and substrate 12 are removed from the apparatus for separation and further processing of the substrate.

By the term constant temperature is meant substantially constant, meaning that even though a temperature controller is set to maintain a certain temperature, the actual temperature obtained will inevitably fluctuate to a certain extent. The stability of the constant temperature is mainly dependent on the accuracy of the temperature controller, and inertia of the entire setup. Furthermore, it is understood that even though the method according to the invention is usable for imprinting extremely fine structures down to single nanometers, a slight temperature variation will not have a major effect as long as the template is not too large. Assuming that the structures at the periphery of the template has a width x, and a reasonable spatial tolerance is a fraction of that width, such as y=x/10, then y becomes the parameter setting the temperature tolerance. In fact, it can easily be calculated which effect differences in thermal expansion will have, by applying the respective coefficients of thermal expansion for the materials of the template and substrate, the size, typically the radius, of the template, and the spatial tolerance parameter y. From such a calculation, a suitable temperature tolerance for the temperature controller can be calculated and applied to the machine for performing the process.

Advantages of the application of flexible polymer foils within a "two-step" imprint process as described above and displayed in FIG. 1 include the following:

The flexible properties of the used polymer foils alleviate complications of the pattern transfer due to different thermal expansion coefficients of the applied stamp and substrate materials used in the imprint-process. Therefore, the technique offers possibilities to transfer patterns between surfaces of materials characterized by different thermal expansion coefficients. Nevertheless, most polymers used in the application are characterized by quite similar thermal expansion factors typically ranging between 60 and $70 \times 10^{-6} °C^{-1}$ making imprints between two different polymer foils as displayed in FIG. 1e) more easy in terms of manufacturing.

The flexible and ductile properties of the used polymer foils prevent the inclusion of air during the imprint between the polymer foil—having either a patterned or non-patterned surface—and the other object—e.g. a substrate covered by a polymer film or a template, comprising silicon, nickel, quartz or a polymer material. If the foil is pressed towards one of these objects as displayed in FIG. 1b, 1e, 1h the polymer foil is acting like a membrane, pressing the air from the centre of the imprinted area to its edges where it can leave the imprinted region.

Due to the softness of the used polymer foils particles between the polymer foil and the template or object to which it is pressed, as well as pronounced surface roughness of the template or object, evident damages during an imprint process displayed in FIG. 1b), 1e) and 1h) of either the polymer foil or of one of the involved objects will be prevented.

Due to the high transparency of the used polymer foils to e.g. UV-radiation, also UV-curable polymers can be used during the imprint process described above, even when non-transparent templates and substrates are used.

The very low surface energies of the most of the applied polymer foils lead to pronounced anti-adhesion properties against other materials, making it ideal to apply them in an imprint process. The deposition of additional anti-adhesion layers on low surface energy polymers is in the most cases not necessary making the process described above simple and industrially applicable. Clearly spoken, it is possible to make the polymer replica stamp in an anti-adhesive material.

The process described above and displayed in FIG. 1 is very suitable to produce both positive (the pattern is similar to that of the original template) and negative (the pattern is inverted to that of the original template) replicas if the material properties of the different polymer materials—e.g. glass transition temperature, optical transparency, and curability after exposure to radiation—applied in the process are adapted to each other.

The aging and wear resistance of the used flexible polymer stamps make it possible to apply them several times in the secondary step of the imprint process. Alternatively, the polymer stamps are used only once and are then thrown away. In any case, this enhances the lifetime of the original template 1, which never has to be used for imprint against a hard and non-flexible material.

The flexible and ductile properties of the used polymer foils alleviate demolding of the inflexible stamp or substrate from the flexible foil reducing physical damages on the stamp or the substrate.

Instead of mechanical demolding of the polymer foil from a substrate after performed imprint, the polymer foil can alternatively be chemically dissolved with the help of a suitable solvent. This procedure would be preferred in case of a transfer of patterns having high aspect ratios, i.e. where the depth of a pattern structure is substantially larger than its width, were mechanical demolding could damage the substrate or the stamp.

Not only the pattern on the surface of an original template but also the physical dimension of the original template can easily be transferred into a polymer foil. In some applications the placement of the pattern on the final substrate is critical. For e.g. hard disk drives the pattern should be replicated and aligned to the centre of the disk. Here, the master stamp can be produced with a centre hole. After imprint a relief of the centre hole is formed into the flexible polymer foil, which can be used for aligning the pattern on the foil to the final replicated disk.

A replica generated in a polymer sheet can give access to a novel family development process, which is not executable the common way by nickel-to-nickel plating. Here, the imprinted polymer sheet is first bonded together with a rigid substrate by, e.g., a UV-assisted imprint process. Thereafter the sheet is metalized with a seed layer and electroplated to receive a nickel copy of the original. Many other conversion process are accessible via the described invention.

EXAMPLES

Some polymer foils which have been used are:

Topas 8007 from Ticona GmBH, Germany: thermoplastic random co-polymer having a glass temperature of 80° C. Topas is transparent to light with wavelengths above 300 nm and is characterized by a low surface energy. The foil is available in thicknesses of 50-500 µm. 130-140 µm thick foils have been used here.

Zeonor ZF14 from Zeon Chemicals, Japan: thermoplastic polymer having a glass temperature of 136° C. and a light transmittance of 92% for wavelengths above 300 nm. The used foil has a thickness of 188 µm but is available in other thicknesses ranging from 50 to 500 µm.

Zeonex E48R from Zeon Chemicals, Japan: thermoplastic polymer having a glass temperature of 139° C. and a light transmittance of 92% for wavelength above 350 nm. The used foil has a thickness of 75 µm.

Polycarbonate (Bisphenol-A polycarbonate) from Bayer AG, Germany: thermoplastic polymer having a glass temperature of 150° C. and a light transmittance of 91% for wavelength above 350 nm. The used foil has a thickness of 300 µm and is available in many other thicknesses up to 1 mm.

A resist material which has been used is SU8 from MicroChem Corp. USA, a photo-resist material, curable after exposure to light having wavelengths between 350 and 400 nm. As an adhesion promoter between the SU8 film and the silicon substrate a thin LOR0.7 film from MicroChem Corp. USA has been used.

Example 1

Figure 2:
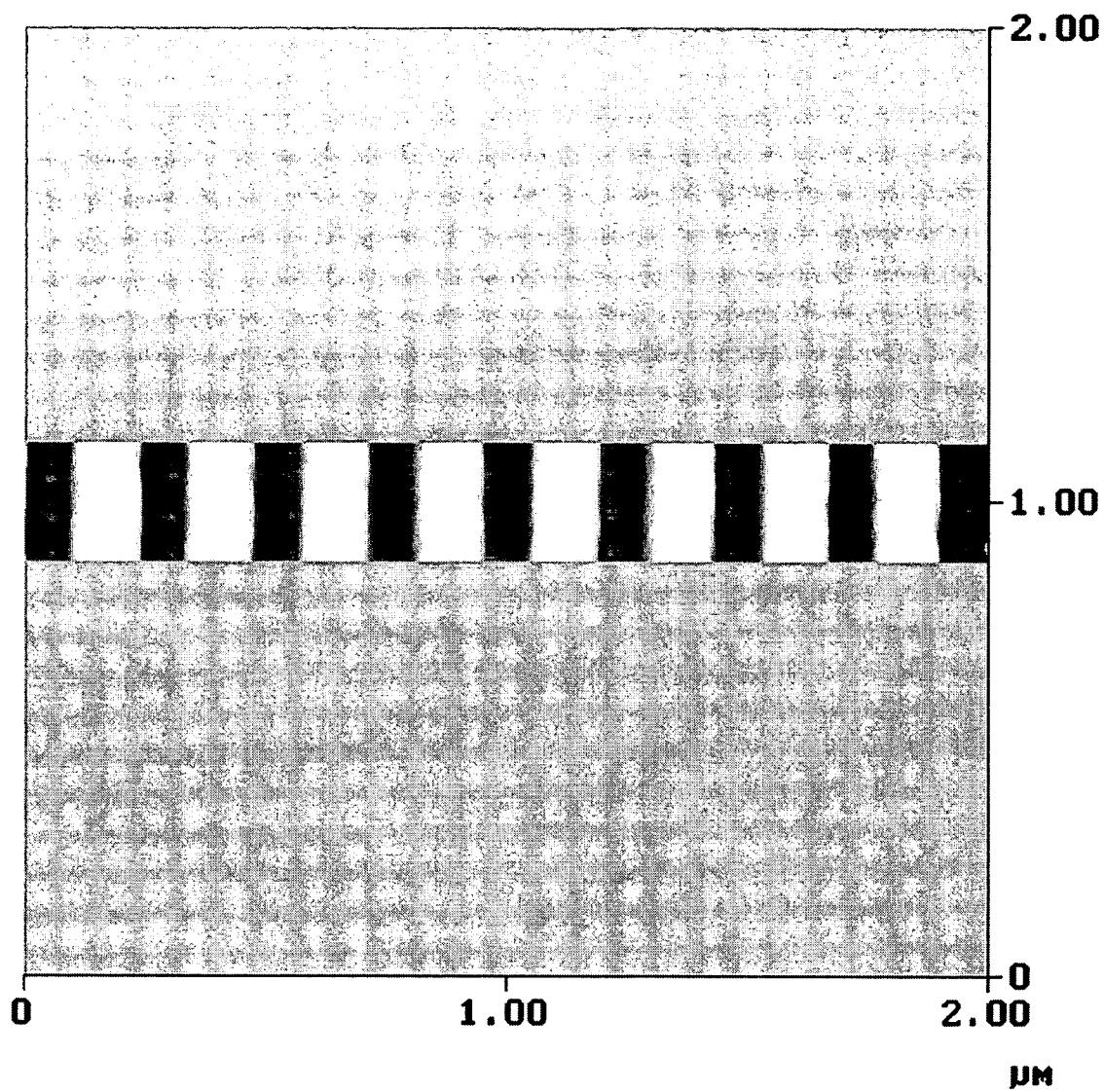
FIG. 2 shows an AFM tapping mode image of a line pattern, imprinted in SU8 by means of a methods according to an embodiment of the invention.

A nickel template whose surface exhibits a line pattern, having a line width of 80 nm and a height of 90 nm has been imprinted into a Zeonor ZF14 foil at 150° C. and 50 bar for 3 min. None of the surfaces has been treated by any additional coating such as, e.g. anti-adhesion layers. The release temperature was 135° C., at which the Zeonor foil could mechanically be removed from the nickel surface without damaging the pattern of neither the template nor the replica. The Zeonor foil has been used as a new template, which has been imprinted into a 100 nm thick SU8 film. The SU8 film was spin-coated onto a 20 nm LOR film, previously spin-coated onto a silicon substrate. Also here, none of the surfaces has been treated by an additional coating, having the purpose to improve the anti-adhesion behaviour between the SU8 film and the Zeonor foil. The imprint was performed at 70° C. and 50 bar for 3 min. The SU8 film was exposed to UV-light for 4 seconds through the optically transparent Zeonor foil and baked for two more minutes. Both temperature and pressure were kept constant at 70° C. and 50 bar, respectively, during the entire imprint sequence. The release temperature was 70° C. at which the Zeonor foil could mechanically be removed from the SU8 film without damaging the pattern of neither the polymer template foil nor the replica film. The AFM image of an imprint result in the SU8 film deposited on a silicon wafer is shown in FIG. 2.

Example 2

Figure 3:
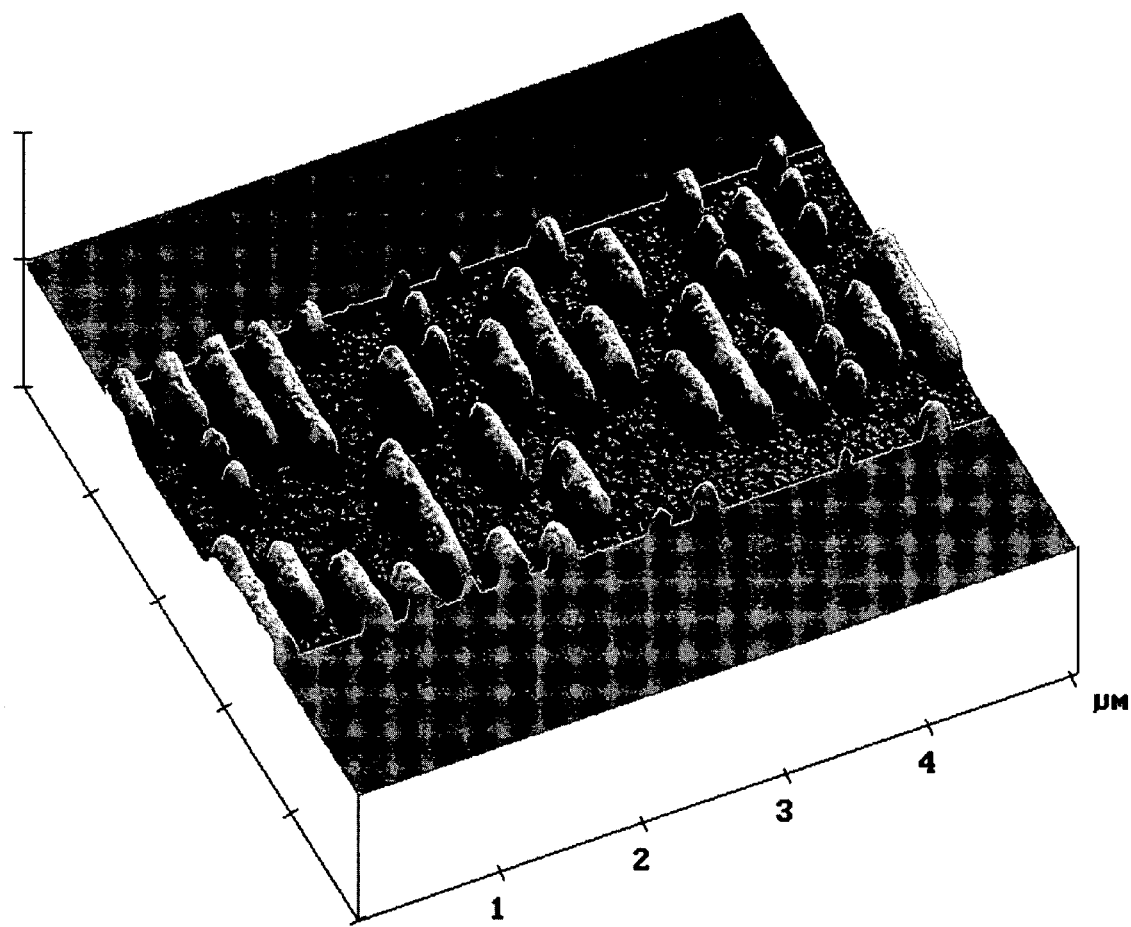
FIG. 3 shows an AFM tapping mode image of a BluRay optical disk pattern, imprinted in SU8 according to an embodiment of the invention.

A nickel template whose surface exhibits a BluRay pattern having structure heights of 100 nm and widths of 150 nm—investigated by AFM—has been imprinted into a Zeonor ZF14 using the same process and the same parameters as already described in Example 1. The Zeonor foil has been used as a new template, which has been imprinted into a 100 nm thick SU8 film. Also here the same process and the same parameters as already described in Example1 have been used. The AFM image of an imprint result in the SU8 film deposited on a silicon wafer is shown in FIG. 3.

Example 3

Figure 4:
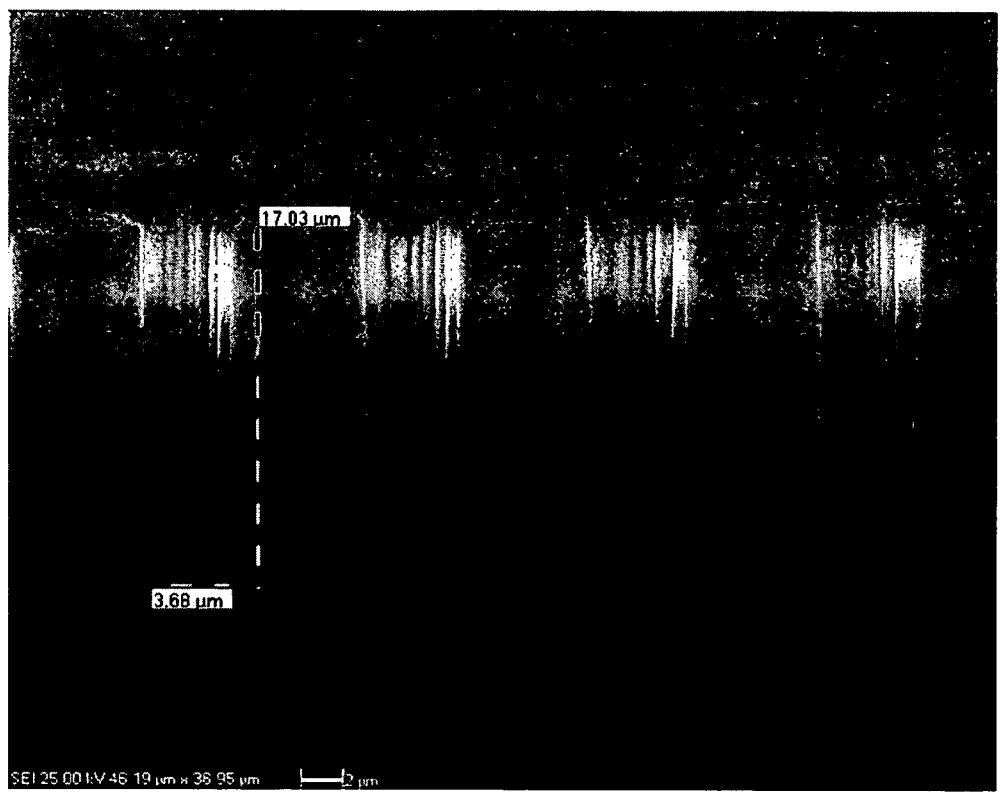
FIG. 4 shows SEM images of a pillar pattern having micrometer dimensions with high aspect-ratios, provided by imprint in accordance with an embodiment of the invention.
Figure 4:
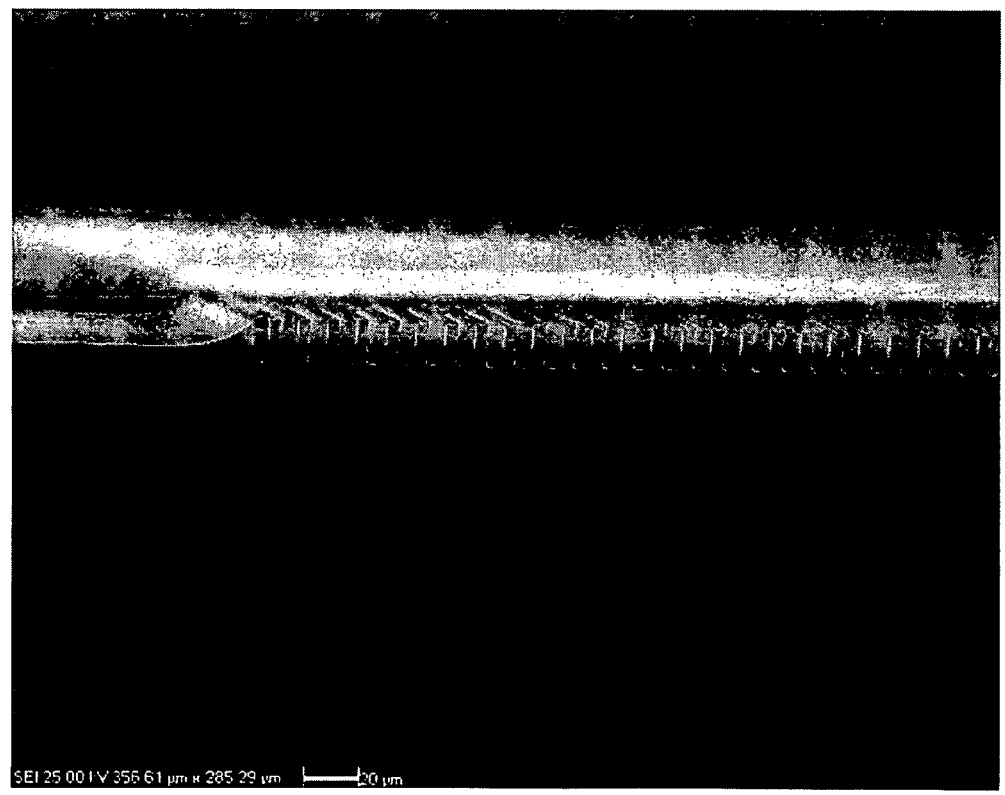

A nickel template has been used whose surface contains micro-meter patterns with high aspect-ratios ranging from 1-28. The feature size ranges from 600 nm to 12 µm, at a height of 17 µm. The surface has been covered by a phosphate-based anti-adhesion film before the imprint. The nickel template has been imprinted into a polycarbonate foil at 190° C. and 50 bar for 3 min. The surface of the polycarbonate foil has not been treated by an additional coating, having the purpose to improve the anti-adhesion behavior between the Ni template and the polycarbonate film. The release temperature was 130° C., at which the polycarbonate foil could mechanically be removed from the nickel surface without damaging the pattern of neither the template nor the replica. The polycarbonate foil has been used as a new template for an imprint into a Topas foil. The imprint has been performed at 120°C. and 50 bar for 3 min. None of the surfaces has been disposed by an additional coating, having the purpose to improve the anti-adhesion behavior between the polycarbonate and the Topas foil. The release temperature was 70° C., at which the Topas could mechanically be removed from the polycarbonate foil without damaging the pattern of neither the template foil nor the replica foil. The Topas foil has then been used as a new template, which has been imprinted into a 6000 nm thick SU8 film spin-coated onto a silicon substrate. Also here, none of the surfaces has been treated by any additional coating, having the purpose to improve the anti-adhesion behavior between the SU8 film and the Topas foil. The imprint was performed at 70° C. and 50 bar for 3 min. The SU8 film was exposed to UV-light for 4 seconds through the optically transparent Topas foil and baked for two more minutes without changing the temperature of 70° C., or the pressure of 50 bar during the entire process. The release temperature was 70° C. Afterwards the Topas foil has completely been dissolved in p-xylene at 60° C. for one hour. An SEM image of the result is shown in FIG. 4.

Experimental

The Imprint processes given in the examples above have been performed with differently patterned Ni stamps, in some cases covered by phosphate-based anti-adhesion films, using different process parameters. The substrates (2 to 6 inch silicon wafers) have been cleaned by rinsing with isopropanol and acetone directly before spinning the LOR and the SU8 films. The sizes of the applied stamps are 2 to 6 inches. The imprints have been carried out using an Obducat-6-inch-NIL equipment, provided with an UV-module.

Atomic force microscopy (AFM) in the tapping mode with the help of a NanoScope IIIa microscope from Digital Instruments was carried out to investigate both the imprint results and the stamps after performed imprint.

Scanning Electron Microscopy (SEM) has been performed using a Obducat CamScan MX2600 Microscope at 25 kV.

The invention claimed is:

1. Method for transferring a pattern from a template having a structured surface to a target surface of a substrate, comprising:
   a primary imprint step including
      creating a polymer stamp having a patterned surface, comprising the step of pressing the structured template surface into a surface layer of a first polymer foil to imprint an inverse of the pattern in the surface layer; and
   a secondary imprint step including
      arranging the polymer stamp and a substrate mutually parallel, with the patterned surface facing the target surface substrate, and with an intermediate layer of a material devised to solidify upon exposure to radiation;
      heating the polymer stamp and the substrate to a temperature $T_p$; and while maintaining said temperature $T_p$, performing the steps of:
         pressing the polymer stamp towards the substrate for imprinting the pattern of the patterned surface into said intermediate layer;
         exposing said layer to radiation for solidifying the intermediate layer; and
         postbaking the intermediate layer while maintaining said temperature $T_p$,
      wherein said material is photo chemically amplified,
      wherein the arranging further comprises arranging the polymer foil and the substrate sandwiched between a stop member and a first side of a flexible membrane, and
      wherein the pressing of the polymer foil towards the substrate involves applying an overpressure to a medium on a second side of the membrane.

2. The method as recited in claim 1, further comprising the step of:
   releasing the substrate from the polymer stamp while maintaining said temperature $T_p$.

3. The method as recited in claim 2, wherein the step of releasing the substrate from the polymer stamp includes the step of dissolving the polymer stamp while still being arranged in contact with the imprinted intermediate layer on the substrate.

4. The method as recited in claim 1, wherein said material is a cross-linkable thermoplastic polymer having an initial glass temperature $T_g$, and wherein $T_p$ exceeds $T_g$.

5. The method as recited in claim 1, wherein said material is a UV cross-linkable thermoplastic polymer having a glass temperature $T_g$, wherein temperature $T_p$ exceeds temperature $T_g$, and wherein said radiation is UV radiation.

6. The method as recited in claim 1, comprising:
   applying said intermediate layer on the substrate by spin-coating said material, prior to the step of arranging said polymer foil and substrate mutually parallel.

7. The method as recited in claim 1, wherein said material is a UV-curable pre-polymer, and wherein said radiation is UV radiation.

8. The method as recited in claim 1, wherein said medium comprises a gas.

9. The method as recited in claim 1, wherein said medium comprises air.

10. The method as recited in claim 1, wherein said medium comprises a liquid.

11. The method as recited in claim 1, wherein said medium comprises a gel.

12. The method as recited in claim 1, comprising:
emitting radiation to said intermediate layer through the polymer foil, the polymer foil being transparent to a wavelength range of a radiation usable for solidifying said material; and
heating said substrate by direct contact with said heater device.

13. The method as recited in claim 1, comprising:
emitting radiation to said intermediate layer through said membrane, which membrane is transparent to a wavelength range of a radiation usable for solidifying said material.

14. The method as recited in claim 1, comprising:
emitting radiation to said layer through said membrane, and through a transparent wall opposing said membrane, defining a back wall for a cavity for said medium, which back wall and membrane are transparent to a wavelength range of a radiation usable for solidifying said material.

15. The method as recited in claim 1, wherein the step of exposing said layer comprises:
emitting radiation from a radiation source within a wavelength range of 100 nm-500 nm.

16. The method as recited in claim 15, comprising:
emitting pulsating radiation with a pulse duration in the range of 0.5 µs-10 µs and a pulse rate in the range of 1-10 pulses per second.

17. The method as recited in claim 1, comprising:
applying a vacuum between said template and said substrate in order to extract air inclusions from said surface layer prior to exposing said layer to radiation.

18. The method as recited in claim 1, wherein the temperature $T_p$ is within the range of 20° C.-250° C.

19. The method as recited in claim 1, wherein the primary imprint step further includes
solidifying the surface layer of the first polymer foil, wherein the first polymer foil is the polymer stamp and the surface layer defines the patterned surface of the polymer stamp.

20. The method as recited in claim 1, wherein the primary imprint step further includes
solidifying the surface layer of the first polymer foil;
pressing the inverse pattern of the first polymer foil into a surface layer of a second polymer foil to imprint a replica of the pattern of the template surface in the surface layer of the second polymer foil; and
solidifying the surface layer of the second polymer foil, wherein the second polymer foil is the polymer stamp and its surface layer defines the patterned surface of the polymer stamp.

21. The method as recited in claim 1, wherein the first polymer foil is made from a thermoplastic polymer or co-polymer material.

22. The method as recited in claim 18, wherein the second polymer foil is made from a thermoplastic polymer or co-polymer material.

23. The method as recited in claim 1, wherein the template is made from metal, quartz, polymer or silicon.

24. The method as recited in claim 1, comprising, while maintaining temperature $T_p$:
releasing the pressure; and
releasing the substrate carrying the intermediate layer on the target surface, from the polymer stamp.

25. The method as recited in claim 1, in which the pattern of the template is transferred to a plurality of substrates, further comprising:
disposing the polymer stamp after the secondary imprint step;
creating a new polymer stamp in a repetition of the first imprint step using said template; and
imprinting a new substrate target surface in a repetition of the second imprint step using the new polymer stamp.

26. The method as recited in claim 1, wherein the first polymer foil is made from polycarbonate, cyclic olefin copolymer (COC), or poly(methyl methacrylate) PMMA.

27. The method as recited in claim 1, wherein the primary imprint step is a thermal imprint process including
providing a polymer foil;
heating the polymer foil to a temperature above its glass transition temperature;
pressing the structured template surface into a surface of the polymer foil;
cooling the polymer foil; and
separating the patterned polymer foil from the template.

28. The method as recited in claim 1, wherein the primary imprint step is a radiation-assisted imprint process including
providing a polymer foil;
providing a radiation-sensitive pre-polymer surface layer on a surface of the polymer foil;
pressing the structured template surface into the surface layer;
exposing the surface layer to radiation through the polymer foil to cure the pre- polymer; and
separating the patterned polymer foil from the template.

29. The method as recited in claim 28, wherein the primary imprint step further includes
providing heat to post-bake the surface layer, before separating patterned polymer foil from the template.

30. The method as recited in claim 1, wherein the primary imprint step is a radiation-assisted imprint process including
providing a polymer foil;
providing a radiation-sensitive cross-linkable polymer surface layer on a surface of the polymer foil;
heating the polymer foil to a temperature above a glass transition temperature of the cross-linkable polymer, and while maintaining said temperature, performing the steps of:
pressing the template towards the surface layer; and
exposing the surface layer to radiation for cross-linking the surface layer.

31. The method as recited in claim 30, wherein the primary imprint step further includes
postbaking the surface layer while maintaining said temperature.

32. The method as recited in claim 31, further comprising the step of
separating the patterned polymer foil from the template.

* * * * *